(12) United States Patent
Shibuya et al.

(10) Patent No.: US 6,787,250 B2
(45) Date of Patent: Sep. 7, 2004

(54) RADIATION DETECTION

(75) Inventors: Kengo Shibuya, Tokyo (JP); Masanori Koshimizu, Tokyo (JP); Yuko Takeoka, Kanagawa (JP); Keisuke Asai, Tokyo (JP)

(73) Assignee: Japan Science and Technology Agency, Saitama (JP)

( * ) Notice: Subject to any disclaimer, the term of this patent is extended or adjusted under 35 U.S.C. 154(b) by 133 days.

(21) Appl. No.: 10/182,924

(22) PCT Filed: Dec. 7, 2001

(86) PCT No.: PCT/JP01/10763

§ 371 (c)(1),
(2), (4) Date: Jul. 29, 2002

(87) PCT Pub. No.: WO02/056056

PCT Pub. Date: Jul. 18, 2002

(65) Prior Publication Data

US 2004/0084654 A1 May 6, 2004

(51) Int. Cl.$^7$ ................................. G01T 1/20
(52) U.S. Cl. ..................... 428/690; 534/15; 564/118; 250/370.11; 250/370.12; 250/483.1
(58) Field of Search ..................... 428/690; 252/301.17, 252/301.18, 301.16; 534/15; 564/118; 250/370.11, 370.12, 483.1

(56) References Cited

U.S. PATENT DOCUMENTS

| | | | |
|---|---|---|---|
| 5,864,141 A | 1/1999 | Majewski et al. | 250/383.02 |
| 5,882,548 A * | 3/1999 | Liang et al. | 252/301.16 |

OTHER PUBLICATIONS

Ishihara et al, "Exciton State in Two–Dimensional Pervoskite Semiconductor (C10H21NH3)2Pbl4", Solid State Comm. vol. 69, No. 9, 1989, pp. 933–936.*

Mitzi, "Templating and Structural Engineering in Organic–Inorganic Pervolskites", Jour. Chem. Soc., Dalton Trans., 2001, p. 1 12.*

Ishihara et al., Exciton State in Two–Dimensional Perovskite Semiconductor ($C_{10}H_{21}NH_3$)$_2$Pbl$_4$, Solid State Communications, vol. 69, No 9, 1989, p. 933–936.

Mitzi, Templating and Structural Engineering in Organic–Inorganic Perovskites, Journal of Chemical Society, Dalton Trans., 2001, p. 1–12.

* cited by examiner

Primary Examiner—C. Melissa Koslow
(74) Attorney, Agent, or Firm—Gary C Cohn PLLC

(57) ABSTRACT

This invention relates to a radiation detection device for detecting ionizing beam discharges such as gamma rays, x-rays, electron beams, charged particle beams and neutral particle beams. Specifically, it relates to a radiation detection device which can measure radiations which exist for a very short time (of the order of subnanoseconds or less) from the appearance of photoemission to extinction.

It is an object of this invention to provide a radiation detection device using a perovskite organic-inorganic hybrid compound as a scintillator, the formula of this compound being ($R^1$—$NR^{11}_3$)$_2MX_4$ or ($R^2$=$NR^{12}_2$)$_2MX_4$, or alternatively, ($NR^{13}_3$—$R^3$—$NR^{13}_3$)$MX_4$ or ($NR^{14}_2$=$R^4$=$NR^{14}_2$)$MX_4$ (in the formula, $R^1$ is a monovalent hydrocarbon group which may contain a heterocyclic ring and may be substituted by halogen atoms, $R^2$ is a divalent hydrocarbon group which may contain a heterocyclic ring and may be substituted by halogen atoms, and may be cyclic, $R^3$ is a divalent hydrocarbon group which may contain a heterocyclic ring and may be substituted by halogen atoms, $R^4$ is a tetravalent hydrocarbon group which may contain a heterocyclic ring and may be substituted by halogen atoms, $R^{11}$–$R^{14}$ may be identical or different, and may be hydrogen atoms or alkyl groups having two or more atoms, M is a Group IVa metal, Eu, Cd, Cu, Fe, Mn or Pd, and X is a halogen atom). This radiation detection device can quantify the radiation amount of the detected radiation.

8 Claims, 3 Drawing Sheets

RADIATION DETECTION

TECHNICAL FIELD OF THE INVENTION

This invention relates to a radiation detection device for detecting ionizing beam discharges such as gamma rays, x-rays, electron beams, charged particle beams and neutral particle beams. Specifically, it relates to a radiation detection device which can measure radiation beams which exist for a very short time (of the order of subnanoseconds or less) from the appearance of photoemission to extinction.

PRIOR ART

To detect or measure ionizing beams, a scintillation counter is used. In recent years, it has become necessary to measure very short pulse radiations of the order of nanoseconds in a radiation field.

The scintillator must have the following functions: (i) High scintillation efficiency and large photoemission amount (ii) Short photoemission appearance time and decay time (iii) High resistance to radiation (iv) It should permit measurement of the radiation amount. Until now, however, no scintillator material was capable of satisfying all these conditions simultaneously.

In the scintillators of the prior art, inorganic crystals such as NaI (Tl), CsI (Tl) and ZnS (Ag) were used, but they could only be used in units as slow as microseconds ($10^{-6}$) from the appearance of photoemission to extinction, and were not able to respond to the measurement of short pulse radiations of nanosecond order ($10^{-9}$). On the other hand, although organic crystals such as anthracene or naphthalene had a fast response in nanosecond units, their fluorescence efficiency was low and photoemission amount was small, hence measurement precision was low and as their radiation resistance was low, they were not suitable for practical use.

For this purpose, the structure and characteristics of organic-inorganic laminar perovskites, especially bis(alkylammonium) metal (II) tetrahalides represented by $(C_nH_{2n+1}NH_3)_2MX_4$ (in the formula, n is an integer from 2–18, M is Cd, Cu, Fe. Mn, Pd or Pb, X is Cl, Br or I), have been studied (E. D. T. Ogawa and Y. Kanemitsu, "Optical properties of low-dimensional Materials", Chapter 6, World Scientific (1995); D. B. Mitzi, "Templating and structural engineering in organic-inorganic perovskites", J. Chem. Soc., Dalton Trans., 2001, 1–12). The structure of organic-inorganic laminar perovskites represented by $(C_nH_{2n+1}NH_3)_2PbI_4$ (in the formula, n is 4–14) have been studied in particular detail.

It is known that due to the low-dimensional (two-dimensional in FIG. 1) quantum well structure shown in FIG. 1, they have a stable and powerful exciton emission (T. Ishihara et. al. Solid State Communications 69(9), 933–936 (1989)), and very interesting results have been obtained such as photoemission in the visible region due to electronic transitions in the PbI4 layer which is the inorganic layer, when irradiated with ultraviolet light.

Problems to be Solved by the Invention

The inventors discovered that the radiation resistance of exciton photoemissions of perovskite organic-inorganic hybrid compounds having a quantum well structure was high, and that this type of perovskite organic-inorganic hybrid compound could be used for detecting very short pulse ionizing beams and measuring radiations. This invention thus provides a new scintillator using exciton emissions, and makes it possible to provide a simple device which can, in a short time, detect very short pulse radiations which formerly required very complex systems and difficult procedures.

Regarding the decay constants of the emissions of these scintillators, whereas that of anthracene which is a typical organic crystal is 30 nanoseconds, and that of sodium iodide which is a typical inorganic crystal doped with thallium is 230 nanoseconds, it is reported that the free exciton emission of halide organic-inorganic perovskite compounds is 91 picoseconds, which is at least two digits faster response than that of the organic crystal.

Means to Solve the Problems

This invention provides a radiation detection device which, due to the low dimensional quantum well structure of perovskite organic-inorganic hybrid compounds, can detect very short pulse ionizing beams (gamma rays, x-rays, electron beams, charged particle beams and neutron beams) which was not possible using radiation detection devices applying the scintillators of the prior art. This is done by using intense exciton emissions which exist for only a short time from appearance to extinction, and also permits the radiation characteristics to be measured.

This invention focuses on the fact that exciton emissions of perovskite organic-inorganic hybrid compounds are short-lived and powerful, and that this exciton emission can be used for radiation detection and radiation amount measurement. Pigments, which are well known as exciton emission materials, have a low radiation resistance, and therefore exciton emission materials could not be used as scintillators in the prior art. However, the inventors systematically studied the strong irradiation of perovskite organic-inorganic hybrid compounds having the structures shown in FIG. 1 and FIG. 2, and the exciton emissions of these compounds, and discovered that these compounds had a very high radiation resistance. The life of exciton emissions of the perovskite organic-inorganic hybrid compounds of this invention was a short as several tens of picoseconds, the flux energy of the excitons reached 300 meV or more, and they had a strong exciton emission even at room temperature.

Therefore, the perovskite organic-inorganic hybrid compounds of this invention having a high radiation resistance can be used as ideal exciton emission scintillators satisfying all the conditions (i)–(iv) which were desired in the prior art.

Specifically, this Invention Provides

A radiation detection device using a perovskite organic-inorganic hybrid compound as a scintillator, the formula of said compound being $(R^1-NR^{11}_3)_2MX_4$ or $(R^2=NR^{12}_2)_2MX_4$, or alternatively, $(NR^{13}_3-R^3-NR^{13}_3)MX_4$ or $(NR^{14}_2=R^4=NR^{14}_2)MX_4$ (in the formula, $R^1$ is a monovalent hydrocarbon group which may contain a heterocyclic ring and may be substituted by halogen atoms, $R^2$ is a divalent hydrocarbon group which may contain a heterocyclic ring and may be substituted by halogen atoms, and may be cyclic, $R^3$ is a divalent hydrocarbon group which may contain a heterocyclic ring and may be substituted by halogen atoms, $R^4$ is a tetravalent hydrocarbon group which may contain a heterocyclic ring and may be substituted by halogen atoms, $R^{11}$–$R^{14}$ are, identical or different, hydrogen atoms or alkyl groups having less than two carbon atoms, M is a Group IVa metal, Eu, Cd, Cu, Fe, Mn or Pd, and X is a halogen atom). This radiation detection device can measure the radiation amount of the detected radiation. Further, this radiation detection device may comprise scintillators disposed on a solid substrate. Any suitable solid substrate can be used, provided it has no photoemission and does not interfere with the measurement, and it may for example be a silicon crystal. Further, the hydrocarbon groups in the above perovskite organic-inorganic hybrid compound may be cross-linked. This invention may be used as a radiation scintillator of the above perovskite organic-inorganic hybrid compound.

DETAILED DESCRIPTION OF THE INVENTION

The invention will now be described in more detail.

The radiation detection device of this invention comprises a scintillator and a photoreceptor, and uses a perovskite organic-inorganic hybrid compound as the scintillator.

As the scintillator emits light in the visible region, it is desirable that the photoreceptor uses a photomultiplier tube. There is no particular limitation on the construction of the radiation detection device, typical examples being a construction wherein the scintillator comes in contact with a light-receiving surface of the photomultiplier tube (for example, a construction wherein the scintillator is coated on the light receiving surface of the photomultiplier tube), a construction wherein the scintillator and the multiplier are connected by an optical waveguide, a construction wherein the light emitted by the scintillator is received by the photomultiplier tube distant from the scintillator, and a construction wherein the light from the scintillator is received by an optical port distant from the scintillator, this optical port and photomultiplier tube being connected by an optical waveguide.

The signal from the photoreceiver is processed by the usual method.

Figure 1:
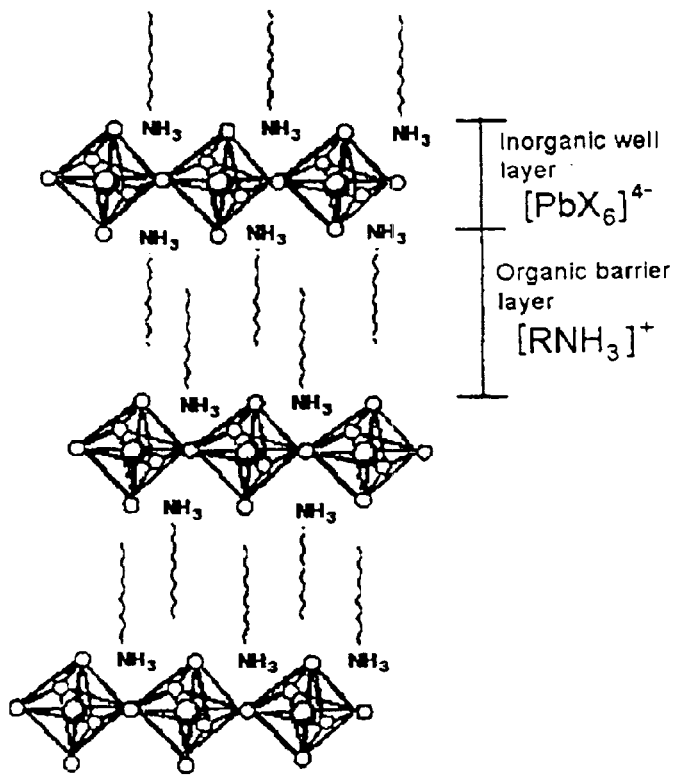
FIG. 1 is a schematic view of a laminar structure (low dimensional quantum well structure) of an organic-inorganic perovskite compound represented by $(R-NH_3)_2MX_4$.
Figure 2:
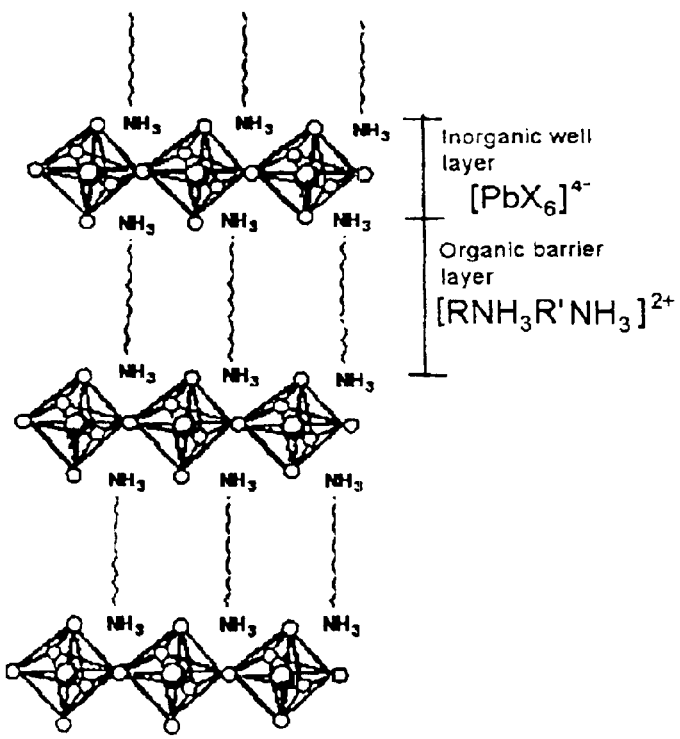
FIG. 2 is a schematic view of a laminar structure (low dimensional quantum well structure) of an organic-inorganic perovskite compound represented by $(NH_3-R'-NH_3)MX_4$.
Figure 3:
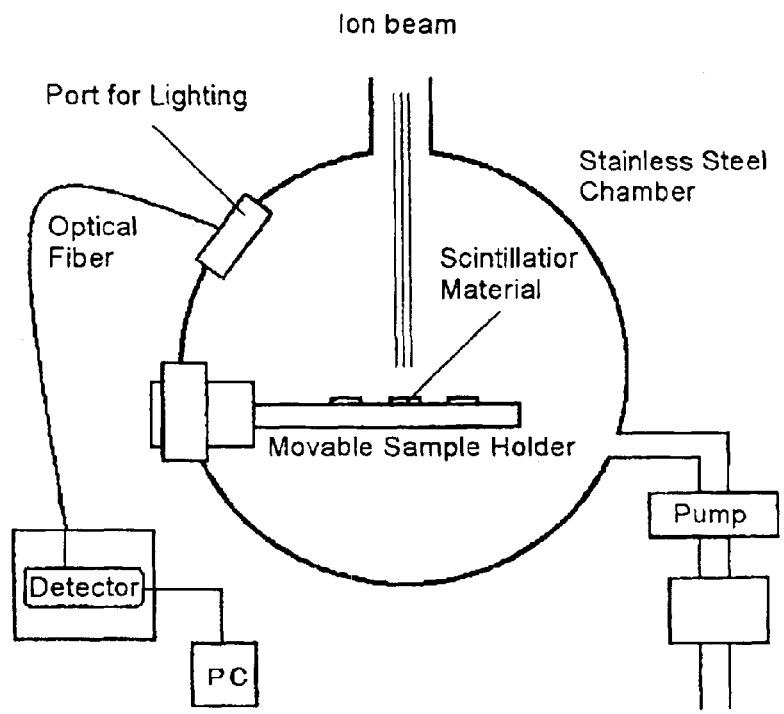
FIG. 3 is a schematic view of an example of the radiation detection device of this invention.

FIG. 3 shows an example of the radiation detection device.

The perovskite organic-inorganic hybrid compound used in this invention is represented by the general structure $(R^1-NR^{11}_3)_2MX_4$ or $(R^2=NR^{12}_2)_2MX_4$, or alternatively, $(NR^{13}_3-R^3-NR^{13}_3)MX_4$ or $(NR^{14}_2=R^4=NR^{14}_2)MX_4$.

$R^1$ is a monovalent hydrocarbon group which may be substituted by a halogen atom, and may be straight chain, chain, branched or cyclic. It generally has 2–18 carbon atoms, and is an alkyl group, aryl group or aralkyl group, alkyl being preferred. As the aryl group, phenyl is preferred, and as the aralkyl group, $(C_6H_5)C_nH_{2n}$ (n is 2–4) is preferred. $R^1$ may also contain a heterocyclic ring such as a pyrrole group or thiophene group. $R^{11}$, may be identical or different, is a hydrogen atom or an alkyl group having 2 or less carbon atoms, hydrogen or methyl being preferred, and hydrogen being more preferred.

$R^2$ is a divalent hydrocarbon group which may contain a heterocyclic ring and may be substituted by a halogen atom. $R^{12}$, may be identical or different, is a hydrogen atom or an alkyl group having 2 or less carbon atoms, hydrogen or methyl being preferred, and hydrogen being more preferred.

$R^3$ is a divalent hydrocarbon group which may be substituted by a halogen atom, and may contain a heterocyclic ring. Examples of divalent hydrocarbon groups are straight chain, branched or preferably straight chain alkylene groups generally having 2–18 carbon atoms. These may contain a heterocyclic ring such as phenylene ($-C_6H_4-$), preferably p-phenylene, or a pyrrole group or thiophene group. $R^3$ may also comprise only heterocyclic rings. An example of a perovskite organic-inorganic hybrid compound comprising thiophene is the compound having the structural formula:

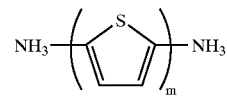

(in the formula, m is an integer from 2–8). $R^{13}$, may be identical or different, is a hydrogen atom or an alkyl group having 2 or less carbon atoms, hydrogen or methyl being preferred, and hydrogen being more preferred.

$R^4$ is a tetravalent hydrocarbon group which may contain a heterocyclic ring and may be substituted by a halogen atom, and it may be cyclic. An example of a perovskite organic-inorganic hybrid compound when $R^4$ is cyclic is the compound having the formula:

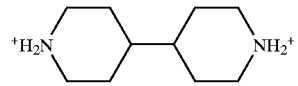

$R^{14}$, may be identical or different, is a hydrogen atom or an alkyl group having 2 or less carbon atoms, hydrogen or methyl being preferred, and hydrogen being more preferred.

When $R^1-R^4$ contain an unsaturated bond such as a double bond or triple bond, the high energy of the radiation is absorbed and gives rise to free radical reactions, which is desirable. However, it is also possible to form a perovskite organic-inorganic hybrid compound using a precursor having a double bond or triple bond in $R^1-R^4$, and then eliminate these unsaturated bonds by cross-linking due to irradiation by the high energy radiation. In this case, by cross-linking the organic layer comprising the hydrocarbon groups, discrepancies in crystal structure due to heat, etc. are decreased, and the performance when it is used as a scintillator is stabilized.

X represents a halogen atom, preferably Cl, Br or I. M is a Group IVa metal, Eu, Cd, Cu, Fe, Mn or Pd. A Group IV metal or Eu is preferred, a Group IVa metal is more preferred, GE, Sn or Pb is still more preferred and Pb is most preferred.

As the radiation detection device of this invention has a high resistance to radiation, it is suitable for the detection of ionizing radiations such as gamma rays, x-rays, electron beams, charged particle beams and neutron beams. Further, it permits detection of short pulse ionizing radiations of nanosecond order which could not be measured by the scintillation counter of the prior art.

The radiation detection device using the perovskite organic-inorganic hybrid compound of this invention generally has the following practical advantages.

Firstly, the excitons of the perovskite organic-inorganic hybrid compound of this invention are stable and exhibit an intense exciton photoemission even at ordinary temperature. Secondly, it is easy to manufacture a scintillator. As the organic-inorganic hybrid compound of this invention spontaneously forms an organic-inorganic laminar hybrid structure, the scintillator can be manufactured simply by dissolving a powdered crystalline substance in an organic solvent and spin coating. Thus, it can be manufactured very easily, economically and in large amounts. Thirdly, an expensive photoreceiver is not required for radiation detection. The exciton photoemission of the organic-inorganic hybrid compound of this invention has a single peak, and as the wavelength of the photoemission peak does not shift and the half value amplitude does not vary during measurement, the photoemission amount can be measured without using a photoreceptor. The main structural features of the measuring system are simply optical fibres for sampling light and detectors, which makes it possible to construct a simple system at very low cost. Further, as this information can be acquired simultaneously with the irradiation of the radiation, it has very wide applications.

EXAMPLES

The following examples illustrate the invention without however limiting it.

Example 1

A laminar perovskite compound $(C_6H_{13}NH_3)_2PbI_4$ was synthesized by reacting lead iodide $PbI_2$ as a halogenated metal and $C_6H_{13}NH_3I$ as an organic amine halogenated hydroacid salt in a molar ratio of 1:2 in N,N'-dimethylformamide (reaction temperature: room temperature (20 degree C.), reaction time: 1 hour or more).

1 g of this laminar perovskite compound was dissolved in 3 ml of acetone, and spin-coated on a silicon (Si) substrate of 2 cm angle using a Shimadzu Laboratories P/N 202-32016 (rotation speed: 5000 rpm, time: 30 seconds or more) to manufacture a scintillator (thickness of laminar perovskite compound 0.1 μm). Here, a silicon substrate was used to avoid photoemission from the substrate.

FIG. 3 shows the radiation detection device used in this example. This device comprises a stainless steel cylinder of diameter approximately 50 cm, and comprises a window through which the radiation enters, a light receiving port, a sample holder and a pressure reducing device. The sample holder may be movable so that a sample, (i.e., the scintillator) can be positioned substantially in the centre of the cylinder. The light receiving port is connected to an external detector by an optical waveguide, and the light amount received is measured and recorded. The detector used comprised a spectrometer: Acton Research Corporation, SpectraPro 150, grating: Acton Research Corporation (150 gr/mm, Blaze 500 nm) and CCD camera: Prinston instruments, 330×1100 (8 ch).

The scintillator (1 cm×1 cm×0.1 μm) manufactured as described above was set in the sample holder so that the radiation was incident perpendicularly to the laminar perovskite compound surface. Subsequently, the pressure was reduced to $1.0\times10^{-6}$ Torr ($1.33\times10^{-4}$ Pa) using a combination of a rotary pump and turbomolecular pump.

Figure 4:
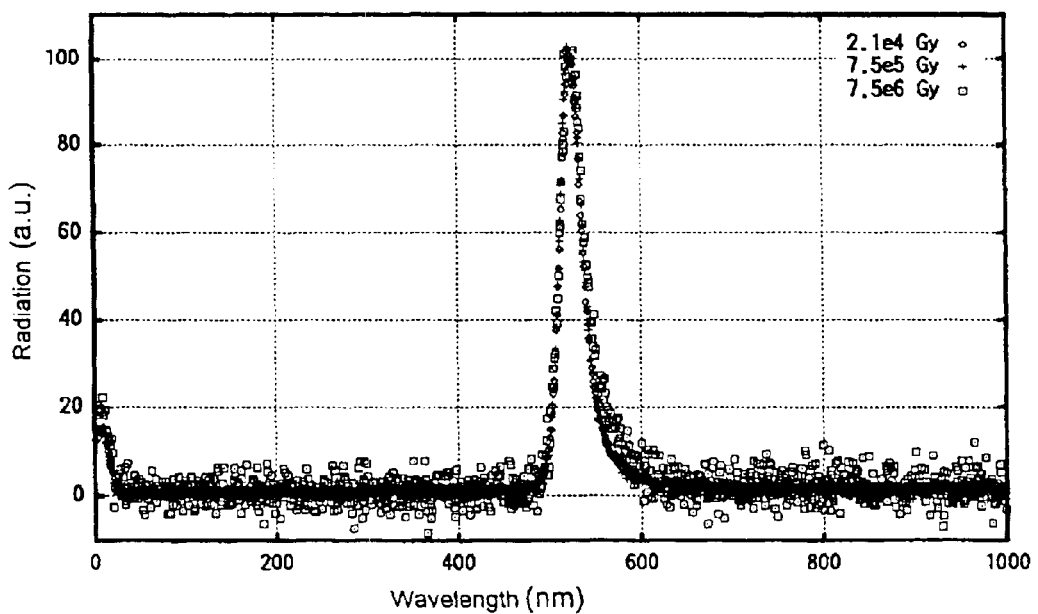
FIG. 4 shows the exciton emission spectra of $(C_6H_{13}NH_3)PbI_4$ relative to absorbed radiation amounts of $2.1 \times 10^4 Gy$, $7.5 \times 10^5 Gy$ and $7.5 \times 10^6 Gy$, normalized by taking the emission intensity of the peak wavelength as 100, and superimposed.

This scintillator was irradiated by hydrogen ions (protons) accelerated to 2 MeV at a flux of $3\times10^{11}$ ions sec-1 cm-2 (50A) at room temperature (Nisshin High Voltage Van der Graaf accelerator), and the irradiation time was varied between 5 seconds, 20 seconds and 180 seconds. As shown in FIG. 4, an intense exciton photoemission having a wavelength of 524 nm (visible region) was observed from this scintillator.

FIG. 4 is a graph showing the exciton emission spectra of $(C_6H_{13}NH_3)PbI_4$ relative to absorbed radiation amounts of $2.1\times10^4$Gy, $7.5\times10^5$Gy and $7.5\times10^6$Gy, normalised by taking the emission intensity of the peak wavelength as 100, and superimposed. Here, the absorbed radiation amount was calculated from the LET (linear energy transfer) found from the TRIM code×thickness of the scintillator (0.1 μm)× number of ions ($3\times10^{11}$ ions sec-1 $cm^{-2}$).

From this figure, it is seen that there is no fluctuation in the photoemission peak shape or wavelength shift. This shows that the scintillator used in this radiation detection device permits detection of radiation by a simple device which does not require a photoreceptor.

Example 2

Figure 5:
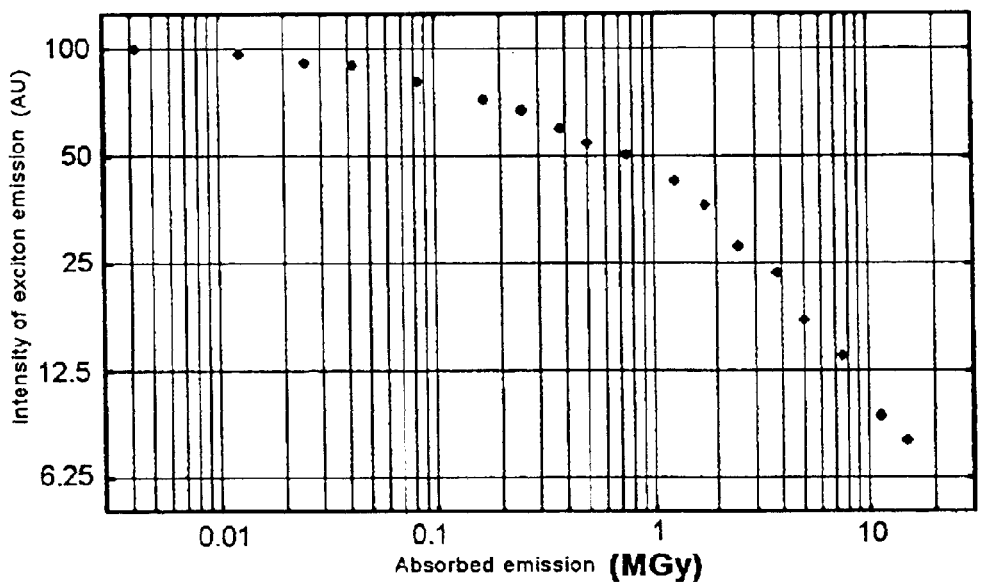
FIG. 5 is a graph (vertical axis, horizontal axis are both logarithmic) showing a relation between the radiation intensity of the exciton emission of $(C_3H_{13}NH_3)_2PbI_4$ and absorbed radiation amount.

The absorbed radiation amount was varied from $4.2\times10^6$ Gy-$1.5\times10^7$Gy, and the relation between the absorbed radiation amount of the laminar perovskite compound and radiation intensity of the exciton photoemission (exciton photoemission amount) was investigated as in the case of Example 1. FIG. 5 shows the relation between the radiation intensity of the exciton photoemission and the absorbed radiation amount of $(C_6H_{13}NH_3)PbI_4$. This radiation intensity was computed from the peak (524±0.5 nm) of the exciton photoemission shown in FIG. 4.

From FIG. 5, it is seen that this exciton photoemission amount decreases gradually as the absorbed radiation amount increases. Therefore, the radiation amount can be directly calculated from the photoemission amount. In other words, the radiation detection device of this invention can measure the radiation amount. Further, the fact that the exciton photoemission amount has this constant functional relationship to the radiation amount over a wide range, shows that a scintillator using the radiation detection device of this invention is suitable for quantitative radiation amount detection.

Example 3

Figure 6:
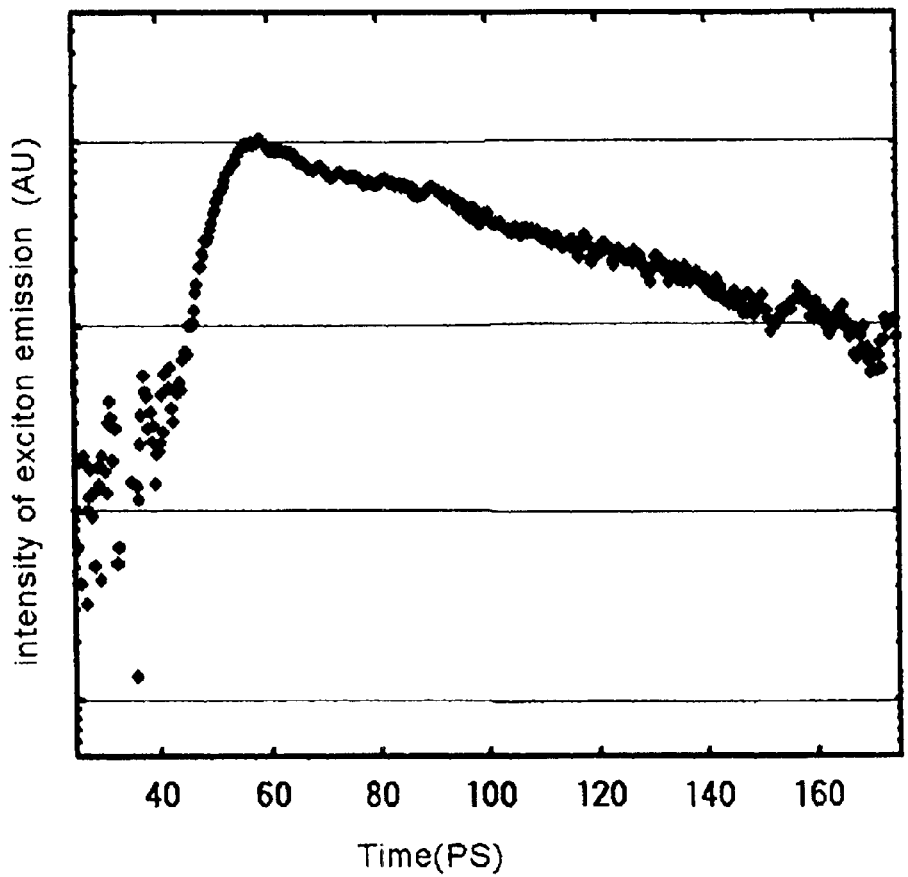
FIG. 6 is a diagram showing a time profile (vertical axis is logarithmic) of the scintillation of $(C_6H_{13}NH_3)PbI_4$.

The scintillator manufactured in Example 1 was excited using a pulse electron beam of pulse width 1 picosecond accelerated to 30 MeV by a linear accelerator (LINAC) in a vacuum (approximately $10^{-6}$ Torr), and the time shift of the integrated intensity of the excited photoemission was measured. The photoreceptor was a streak camera (Yokohama Photonics Corporation, FESCA-200) having a time resolution of 260 femtoseconds. FIG. 6 shows the results. From analyzing this graph, the time constant of the decay of this photoemission was approximately 45 picoseconds.

What is claimed is:

1. A radiation detection device comprising a scintillator, wherein the scintillator is a perovskite organic-inorganic hybrid compound having the formula $(R^1-NR^{11}{}_3)_2MX_4$ or $(R^2NR^{12}{}_2)_2MX_4$, or alternatively, $(NR^{13}{}_3-R^3-NR^{13}{}_3)MX_4$ or $(NR^{14}{}_2=R^4{}_{=NR}{}^{14}{}_2)MX_4$ (in the formula, $R^1$ is a monovalent hydrocarbon group which may contain a heterocyclic ring and may be substituted by halogen atoms, $R^2$ is a divalent hydrocarbon group which may contain a heterocyclic ring and may be substituted by halogen atoms, and may be cyclic, $R^3$ is a divalent hydrocarbon group which may contain a heterocyclic ring and may be substituted by halogen atoms, $R^4$ is a tetravalent hydrocarbon group which may contain a heterocyclic ring and may be substituted by halogen atoms, $R^{11}$–$R^{14}$ are, identical or different, hydrogen atoms or alkyl groups having less than two carbon atoms, M is a Group IVa metal, Eu, Cd, Cu, Fe, Mn or Pd, and X is a halogen atom).

2. The radiation detection device as defined in claim 1, wherein the device can measure the radiation amount of the detected radiation.

3. The radiation detection device as defined in claim 1, wherein the scintillator is disposed on a solid substrate.

4. The radiation detection device as defined in claim 1, wherein the hydrocarbon groups of the perovskite organic-inorganic hybrid compound are cross-linked.

5. A method comprising detecting radiation using a radiation detector, wherein the radiation detector includes a scintillator comprising a perovskite organic-inorganic hybrid compound having the formula $(R^1-NR^{11}{}_3)_2MX_4$ or $(R^2=NR^{12}{}_2)_2MX_4$, or alternatively, $(NR^{13}{}_3-R^3-NR^{13}{}_3)MX_4$ or $(NR^{14}{}_2=R^4NR^{14}{}_2)MX_4$ (in the formula, $R^1$ is a monovalent hydrocarbon group which may contain a heterocyclic ring and may be substituted by halogen atoms, $R^2$ is a divalent hydrocarbon group which may contain a heterocyclic ring and may be substituted by halogen atoms, and may be cyclic, $R^3$ is a divalent hydrocarbon group which may contain a heterocyclic ring and may be substituted by halogen atoms, $R^4$ is a tetravalent hydrocarbon group which may contain a heterocyclic ring and may be substituted by halogen atoms, $R^{11}$–$R^{14}$ are, identical or different, hydrogen atoms or alkyl groups having less than two carbon atoms, M is a Group IVa metal, Eu, Cd, Cu, Fe, Mn or Pd, and X is a halogen atom).

6. The radiation detection device as defined in claim 2, wherein the hydrocarbon groups of the perovskite organic-inorganic hybrid compound are cross-linked.

7. The radiation detection device as defined in claim 3, wherein the hydrocarbon groups of the perovskite organic-inorganic hybrid compound are cross-linked.

8. The radiation detection device as defined in claim 2, wherein the scintillator is disposed on a solid substrate.

* * * * *